United States Patent [19]
Boudou et al.

[11] Patent Number: 4,916,507
[45] Date of Patent: Apr. 10, 1990

[54] POLYSILICON RESISTOR IMPLANTED WITH RARE GAS

[75] Inventors: Alain Boudou, Vert; Jean-Claude Marchetaux, Paris, both of France

[73] Assignee: Bull S.A., Paris, France

[21] Appl. No.: 540,142

[22] Filed: Oct. 7, 1983

[30] Foreign Application Priority Data

Oct. 7, 1982 [FR] France ................... 82 16803

[51] Int. Cl.[4] ................ H01L 21/265; H01L 23/68
[52] U.S. Cl. ........................ 357/51; 357/59;
437/24; 437/27; 437/60; 437/918
[58] Field of Search ................ 357/51, 59, 63

[56] References Cited

U.S. PATENT DOCUMENTS

| 3,796,929 | 3/1974 | Nicholas et al. | 357/51 |
| 3,886,587 | 5/1975 | Nicolay | 357/59 |
| 4,053,925 | 10/1977 | Burr et al. | 357/29 |
| 4,110,776 | 8/1978 | Rao et al. | 357/23 |
| 4,367,580 | 1/1983 | Guterman | 357/59 |
| 4,399,451 | 8/1983 | Shirai | 357/59 |
| 4,416,049 | 11/1983 | McElroy | 357/59 |
| 4,432,008 | 2/1984 | Mattiel | 357/51 |

FOREIGN PATENT DOCUMENTS

WO81/00928 9/1981 PCT Int'l Appl. ........... 357/51

OTHER PUBLICATIONS

"Minority Carrier Lifetime in Ion-Implanted and Annealed Silicon", Applied Physics, Letters, vol. 17, No. 3, pp. 107-109, Aug. 1, 1970; by D. Eirug Davies and S. A. Roosild.
"The Effect of Germanium Ion Implantation Dose on the Amorphization and Recrystallization of Polycrystalline Silicon Films", Journal of Applied Physics, vol. 52, No. 11, pp. 6655-6658, Nov. 1981; by Y. Komen.
Silicon Semiconductor Data, Pergamon Press, pp. 164-165 and 170-173, by Helmut F. Wolf.

Primary Examiner—William D. Larkins
Attorney, Agent, or Firm—Kerkam, Stowell, Kondracki & Clarke

[57] ABSTRACT

A method of fabricating a resistor in a polycrystalline semiconductor material includes rendering the material conductive by a heavy doping implantation of ions which are electrically active with respect to the material. Ions which are electrically inactive, for example, argon ions, are then implanted in an area of the material with a concentration that is controlled to form a resistor having a desired resistance value. The method permits the precise and accurate control of the fabrication of load resistors for logic circuits within a very wide resistance range, and the resulting resistance values are a linear function of the concentration of the inactive ions.

18 Claims, 1 Drawing Sheet

POLYSILICON RESISTOR IMPLANTED WITH RARE GAS

BACKGROUND OF THE INVENTION

This invention relates to a method of fabricating electric resistors in a polycrystalline semiconductor material and an integrated circuit device resulting therefrom.

An integrated circuit device is essentially composed of a crystalline semiconductor substrate, usually silicon, having an active surface that embodies various components, an interconnecting lattice and input/output terminals. The components may be created in the surface of the substrate in a conventional manner by the implantation of ions which are active with respect to the crystalline semiconductor material of the substrate, the ions being active in the sense that they define in this material areas of N or P-type conductivity. For silicon, the implanted ions may be, for example, arsenic, phosphorus or boron. The components thus produced, such as MOS (Metal-Oxide Semiconductor) field-effect transistors, are connected to one another as well as to the input-/output terminals by a conductive interconnecting lattice i.e., network formed above the active surface of the substrate by superimposing thereon electrically conducting layers separated by intermediate insulating layers. The intermediate insulating layers may be pierced by holes which are filled with the electrically conducting material to provide a connection between neighboring conducting layers. Typically, at least one conducting layer of the interconnecting network is formed by a polycrystalline semiconductor material, such as polycrystalline silicon, with the object of forming in various areas of the layer elements or components partly contained in the crystalline substrate, such as the gate contacts of MOS transistors or components such as electric resistors, for example.

In accordance with a prior art process currently employed for the formation of such resistors, a first implantation with a small quantity of ions is effected in all the polycrystalline semiconductor material forming the layer of interconnecting network so as to slightly diminish the electric resistance of the material until a value is attained from which will be defined the resistors to be provided in this material. The second stage of the process comprises masking the areas of the polycrystalline semiconductor material representing the resistors to be created and carrying out a second ion implantation with a heavy doping shot in order to considerably lower the electric resistance of the unmasked material and thereby to define the conductive elements of the layer and, possibly, the junctions in the substrate. This technique is, for example, well illustrated in an article by T. Ohzone et al. published in the journal *The Transactions of the IECE of Japan,* vol. E. 63, No. 4, April 1980, pp. 267-274.

This prior art process has numerous drawbacks. The major drawback lies in the difficulty in controlling the implantation process. Experiments show that the resistance of polycrystalline silicon varies from a factor of the order of $10^4$ to $10^6$ for a doping concentration of ions that varies merely by a factor of 10. This very rapid growth of the resistance subjects the adjustment of the doping concentration of ions to very severe stresses.

Moreover, the implanted ions diffuse during subsequent thermal treatments involved in the manufacturing process of the integrated circuit device, and it follows that the concentration of ions in the areas of the material that are intended to form the resistors varies in the course of fabrication of the integrated circuit device in a manner which is difficult to control.

Therefore, it is very difficult at the present time to control satisfactorily the fabrication process of resistors in a polycrystalline semiconductor material so as to afford resistance values with a high degree of precision. Because of the great dispersion of the resistance values obtained, this known technology is presently only applicable to the fabrication of resistors having very high resistance values, on the order of a gigohm or more. With such resistance values, variations on the order of a megohm are of little consequence. Moreover, the straight line portion of the resistivity curve as a function of the doping concentration of ions is at the weakest doping, that is to say, its least sensitivity to the doping. Thus, the integrated circuit devices for which this prior art resistor fabrication method is generally employed are notably the static MOS-type RAM (Random Access Memory) memories.

The above-mentioned diffusion of ions during the course of fabrication of an integrated circuit device also increases the sizes of the areas that are required for the resistors and, hence, is disadvantageous for a high-density integration.

The invention overcomes these disadvantages by offering, on the one hand, very close control over the determination of the resistance values and, on the other, a high-density integration.

SUMMARY OF THE INVENTION

Briefly stated, in one aspect the invention affords a method for the fabrication of a resistor in a polycrystalline semiconductor material that comprises rendering the material conductive by doping the material with a heavy shot, i.e., concentration, of ions that are electrically active relative to the material, and implanting in an area of the material to form said resistor ions that are electrically inactive relative to the material.

The ions are called electrically active relative to the polycrystalline semiconductor material if in such material they are either donors or acceptors and generate areas of N or P-type conductivity therein. The ions are called electrically inactive if in this material they are neither donors nor acceptors and are incapable of producing an N or P-type conductivity in the material. Preferably, the electrically inactive ions belong to the family of rare gases.

Therefore, unlike the prior art technique according to which a small quantity of electrically active ions was implanted in an area of the polycrystalline semiconductor material defining a resistor so as to bring it to a desired value of resistance and, thereafter, a second implantation was conducted with a heavy doping shot, i.e., concentration, of electrically active ions in order to make the material conductive outside the area of the material defining the resistor, the process of the invention comprises initially causing the polycrystalline semiconductor material to assume a low resistance value by implanting electrically active ions in this material with a heavy doping shot and, thereafter, increasing this resistance value by implanting electrically inactive ions in an area of the material delimiting said resistor.

In another aspect, the invention provides an integrated circuit device comprising a polycrystalline semiconductor material which contains ions that are electrically active relative to said material, and an area of the material that forms an electric resistor that contains ions that are electrically inactive relative to said material.

These and other features and advantages of the invention will become apparent from the ensuing description made with reference to the accompanying drawings.

DESCRIPTION OF THE PREFERRED EMBODIMENT

Figure 1:
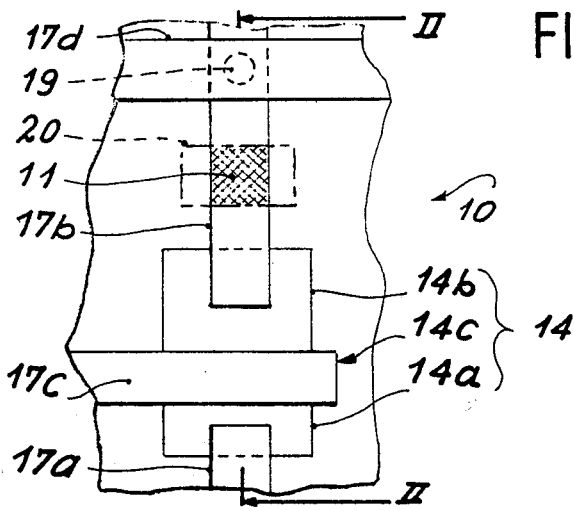
FIG. 1 is a partial top view of an integrated circuit device embodying the invention.
Figure 2:
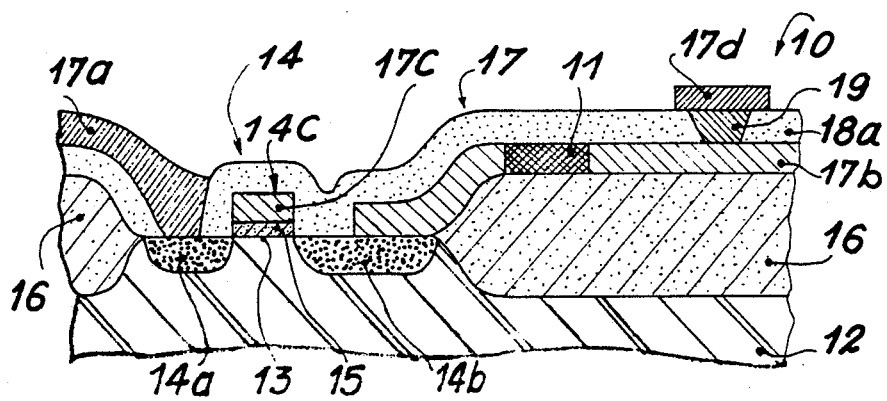
FIG. 2 is a cross-sectional view taken along the line II—II shown in FIG. 1.

FIGS. 1 and 2 show an example of an integrated circuit device 10 incorporating an electric resistor made in accordance with the invention. The part of the device 10 shown comprises a crystalline semiconductor substrate 12, such as silicon, having an active surface 13 that incorporates a MOS field-effect transistor 14 connected to the resistor 11. More specifically, the transistor 14 is formed with a source area 14a and a drain area 14b by the implantation of electrically active ions, for example, arsenic ions, in the substrate 12. The gate 14c area of the transistor 14 comprises a gate electrode 17c formed above the active surface 13 and an insulating layer 15 that is disposed on the surface between the source 14a and the drain 14b areas. The active surface 13 of the substrate 12 further supports an insulating layer 16 of silicon dioxide surrounding the areas defining the transistor 14. Above the layer 16 there is formed a conductive interconnecting lattice or network 17 that may be connected to the various components formed in the substrate 12 of the integrated circuit device 10, such as the transistor 14 and the resistor 11.

The network 17 may be formed of superimposed conductive layers separated by insulating layers. The conductive layers preferably comprise at least one layer of polycrystalline semiconductor material in which electric resistors, in particular, can be formed, and may include a plurality of metal layers, for example, of aluminum, that form conductors. The conductors of two neighboring layers may be connected together by means of holes in the intermediate insulating layer therebetween that are filled with a conductive material for providing the electrical connection. In the device shown in FIGS. 1 and 2, the layer of polycrystalline semiconductor material may include two conductors 17b, 17c forming, respectively, the drain electrode and the gate electrode of the transistor 14, an upper metal layer comprising a conductor 17a that forms the source electrode of the transistor 14, and a conductor 17d connected to the drain electrode 17b by means of conducting material 19 filling a hole in the intermediate insulating layer 18a and by means of a resistor 11. To simplify the drawings, other possible layers have not been shown.

According to the prior art technique, the ions used for the formation of the resistor 11 in the drain conductor 17b of the polycrystalline semiconductor material were active ions, for the same reason as those employed for the formation of the areas of various types of conductivity in the crystalline substrate 12, such as the source 14a and the drain areas 14b of the transistor 14. At first, a small quantity of these active ions was implanted in all of the polycrystalline layer so as to impart to conductors 17b, 17c a resistivity corresponding to that which was desired for the formation of the resistor 11 and all the other resistors. Then a mask was used to mask all the areas of the conductors (such as the conductor 17b) where the resistors were to be provided, and large quantities of active ions were implanted in the entire layer outside said masked areas in order to render it highly conductive.

According to the invention, a heavy uniform doping shot, i.e., concentration, of active ions is preferably first given to the entire polycrystalline layer so as to render it highly conductive. Then by means of a mask 20 (denoted in FIG. 1 by a dash-dot line) exposing only the areas of the layer where the resistors are to be provided, inactive ions are implanted in these areas of the polycrystalline material in a quantity and with an implantation energy sufficient to attain the desired resistance value. The doping of the active ions in the semiconductor material can be made by diffusion at the same time the polycrystalline material is deposited, or subsequent thereto, or by ion implantation following the deposition of the material. Preferably, the inactive ions belong to the family of rare gases, such as argon.

Figure 3:
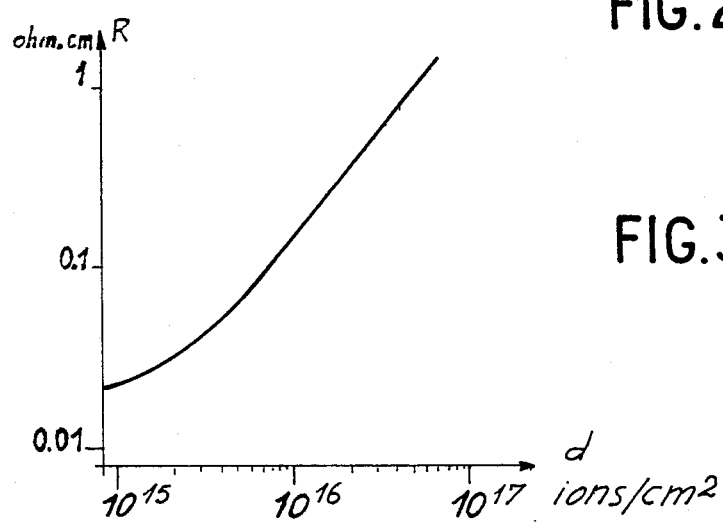
FIG. 3 is a graph showing the variation of resistivity of a material as a function of the doping concentration of the ions implanted therein according to the invention.

FIG. 3 is a graph showing the variation of the resistivity (R) as a function of the dosage, i.e. concentration, (d) of ions implanted per square centimeter in a body of polycrystalline silicon, in accordance with the invention. The body of polycrystalline silicon was 0.4 micrometer thick and was deposited under low-pressure chemical vapor at 630° C. in accordance with a conventional Low-Pressure Chemical Vapor Deposition process (LPCVD). Active arsenic ions were first implanted at 130 keV in all of the material at a concentration of $5 \times 10^{15}$ ions per square centimeter so as to make the material highly conductive. Then, inactive argon ions were implanted at 180 keV in variable doses within the range shown along the abscissa of the graph in FIG. 3. Reheating then took place under nitrogen at 1,050° C. for 30 minutes.

The scales of the abscissa and the ordinate of the curve of FIG. 3 are logarithmic. The values indicated on the abscissa correspond to doses (d) of argon ions ranging from $10^{15}$ to $10^{17}$ ions per square centimeter, for which resistivity values ranging from 0.01 ohm-cm to 1 ohm-cm were obtained. FIG. 3 shows that the curve obtained advantageously has a substantially straight line portion for resistivity values in excess of approximately 0.03 ohm-cm, and is slightly curved at its lower end.

Using the polycrystalline material shown in FIG. 3, a resistor fabricated in accordance with the process of the invention and having a square geometry, such as shown in FIG. 1, will have a value between approximately 250 ohms and 25 kilohms. Furthermore, it is important to note that in the graph of FIG. 3 where the scales of the abscissa and the ordinate are logarithmic, the straight line portion of the curve would be translated into a graph having linear scales by a function which is itself linear and of the type $y = ax + b$. This is remarkable in comparison with the curves representing the previously described prior art process which are represented by non-linear functions having terms of the $ax^n$ type, with n ranging from 4 to 6. This is the reason that the resistance values resulting from the prior art process vary from a factor of $10^4$ to $10^6$ for a simple variation by a factor 10 of the doping concentration of the ions. Thus, as will be appreciated, the process of the invention can indeed be easily controlled in order to obtain rather accurate resistance values. Moreover, it has been found that practically no variations occur in the magnitudes of the resistors during the fabrication of the integrated circuit device embodying the resistors, and that the invention lends itself to the fabrication of integrated circuit devices having a high-density of component integration.

While a preferred embodiment of the invention has been shown and described, it will be apparent that changes can be made in the preferred embodiment without departing from the principles and spirit of the invention, and that the invention is not intended to be limited in any way by the example described and illustrated above. For example, the polycrystalline semiconductor material in which a resistor is provided may be something other than silicon, for example, compounds of semiconductor materials and refractory metals, and the inactive ions can be something other than argon or even a rare gas, provided they are inactive with respect to the polycrystalline material with which they are used. Moreover, considering the resistance values which may be employed using the invention, the components fabricated may be any type of field-effect transistor or bipolar transistor, or other types of active or passive components. Finally, it is understood that any ion implantation process requires reheating and that the values of the reheating parameters given above have been merely by way of non-limitative example, said values being, nevertheless, quite significant because they are presently the most difficult to employ.

We claim:

1. A method of fabricating a resistor in a polycrystalline semiconductor material comprising rendering said material conductive by heavily doping said material with ions that are electrically active with respect to said material, and implanting in an area of said material so as to form said resistor ions that are electrically inactive with respect to said material and of the family of rare gases.

2. The method of claim 1, wherein said implanting comprises controlling the concentration of implanted electrically inactive ions to provide a predetermined resistance value.

3. The method of claim 2, wherein said controlling comprises adjusting the concentration of electrically inactive ions to provide a resistivity value in the range of 0.01 ohm-cm to 1 ohm-cm.

4. The method of claim 1, wherein said electrically inactive ions are argon.

5. The method of claim 1, wherein said implanting comprises exposing said area of the material using a mask where a resistor is to be formed, and implanting said electrically inactive ions in the exposed area.

6. The method of claim 1, wherein said electrically active ions comprise either donor or acceptor ions that form areas in N or P-type conductivity, respectively, and wherein said doping comprises doping the material with active ions of only one type.

7. The method of claim 6, wherein said electrically active ions are selected from the group consisting of arsenic, phosphorus and boron.

8. The method of claim 1, wherein said polycrystalline semiconductor material is selected from the group consisting of silicon, and compounds of semiconductor materials and refractory metals.

9. The method of claim 1, wherein said doping with electrically active ions is effected by diffusion simultaneously with a deposition of said material.

10. The method of claim 1, wherein said doping with electrically active ions is effected by diffusion subsequent to a deposition of said material.

11. The method of claim 1, wherein said doping with electrically active ions is effected by ion implantation subsequent to a deposition of said material.

12. A resistor in an integrated circuit comprising a polycrystalline semiconductor material heavily doped with ions that are electrically active with respect to said material, and an intermediate resistor area in said heavily doped material, the resistor area having implanted ions that are electrically inactive with respect to said material and of the family of rare gases.

13. An integrated circuit device comprising a polycrystalline semiconductor material containing a heavy doping of electrically active ions so as to render said material conductive, and an electric resistor area in said material, said electric resistor area having implanted ions which are electrically inactive with respect to said material and of the family of rare gases.

14. A device according to claim 13, wherein said inactive ions are argon.

15. A device according to claim 13, wherein said polycrystalline semiconductor material is silicon.

16. A device according to claim 13, wherein said material is disposed above a crystalline semiconductor substrate and forms a part of a conductive interconnecting network that connects various components formed in said substrate.

17. The device according to claim 16, wherein said components comprise field-effect transistors.

18. The device according to claim 16, wherein said components comprise bipolar transistors.

* * * * *